US009132620B2

(12) United States Patent
Ahn

(10) Patent No.: US 9,132,620 B2
(45) Date of Patent: Sep. 15, 2015

(54) DELAMINATION APPARATUS AND INLINE THERMAL IMAGING SYSTEM

(71) Applicant: Samsung Display Co., Ltd., Yongin, Gyeonggi-Do (KR)

(72) Inventor: Kyung-Hyun Ahn, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 14 days.

(21) Appl. No.: 14/224,429

(22) Filed: Mar. 25, 2014

(65) Prior Publication Data

US 2014/0290864 A1 Oct. 2, 2014

(30) Foreign Application Priority Data

Mar. 26, 2013 (KR) .......................... 10-2013-0032243

(51) Int. Cl.
*B32B 38/10* (2006.01)
*B32B 43/00* (2006.01)
*H01L 51/00* (2006.01)
*B32B 37/00* (2006.01)

(52) U.S. Cl.
CPC .......... *B32B 43/006* (2013.01); *H01L 51/0013* (2013.01); *B32B 37/0053* (2013.01); *B32B 38/10* (2013.01); *B32B 2457/206* (2013.01); *Y10T 156/1132* (2015.01); *Y10T 156/1174* (2015.01); *Y10T 156/195* (2015.01); *Y10T 156/1944* (2015.01); *Y10T 156/1989* (2015.01)

(58) Field of Classification Search
CPC B32B 38/10; B32B 43/006; Y10T 156/1132; Y10T 156/1174; Y10T 156/1944; Y10T 156/1989
See application file for complete search history.

(56) References Cited

U.S. PATENT DOCUMENTS

| 4,880,488 | A  | * | 11/1989 | Matsuo et al.     | 156/702 |
|-----------|-----|---|---------|-------------------|---------|
| 5,891,298 | A  | * | 4/1999  | Kuroda et al.     | 156/716 |
| 7,798,195 | B2 | * | 9/2010  | Kobayashi et al.  | 156/758 |
| 8,052,835 | B2 | * | 11/2011 | Merrill et al.    | 156/707 |
| 2001/0017189 | A1 | * | 8/2001 | Tsujimoto et al.  | 156/344 |
| 2007/0235131 | A1 | * | 10/2007 | Tsujimoto et al. | 156/344 |
| 2008/0185100 | A1 | * | 8/2008 | Jang et al.       | 156/344 |
| 2009/0288760 | A1 | * | 11/2009 | Garben           | 156/230 |
| 2013/0048223 | A1 | * | 2/2013  | Ahn               | 156/718 |
| 2013/0186574 | A1 | * | 7/2013  | Baker et al.      | 156/707 |

FOREIGN PATENT DOCUMENTS

| JP | 2003-136595    | 5/2003  |
|----|----------------|---------|
| KR | 20070112078 A  | 11/2007 |
| KR | 1020120074639  | 7/2012  |
| KR | 10-2014-0008603 A | 1/2014 |

* cited by examiner

*Primary Examiner* — Mark A Osele
*Assistant Examiner* — Nickolas Harm
(74) *Attorney, Agent, or Firm* — Robert E. Bushnell, Esq.

(57) ABSTRACT

A delamination apparatus includes a stage mounted with a lower supporting member, an acceptor substrate positioned on the lower supporting member, and a donor film laminated along with the lower supporting member via the acceptor substrate interposed therebetween according to the edge of the acceptor substrate, a gripper positioned at an end side of the stage to grip the end of the donor film and moving in a direction away from the acceptor substrate, and a peeling roll positioned on the donor film, including a supporting region supporting a portion of the donor film positioned between the acceptor substrate and the gripper, and including a peeling roll main body rotating itself in a direction of the gripper and a blind selectively covering the supporting region.

20 Claims, 15 Drawing Sheets

DELAMINATION APPARATUS AND INLINE THERMAL IMAGING SYSTEM

CLAIM OF PRIORITY

This application claims priority to and the benefit of Korean Patent Application No. 10-2013-0032243 filed in the Korean Intellectual Property Office on Mar. 26, 2013, the entire contents of which are incorporated herein by reference.

BACKGROUND OF THE INVENTION

1. Field of the Invention

Embodiments of the present invention generally relate to a delamination apparatus and an in-line thermal imaging system including the same, and more particularly, to a delamination apparatus forming an organic layer of an organic light emitting diode (OLED) display and an in-line thermal imaging system including the same.

2. Description of the Related Art

An organic light emitting element is a flat display device. Such an organic light emitting element may include an anode, a cathode, and at least one organic emission layer interleaved between the anode and the cathode. The organic light emitting element has merits of a wide viewing angle and superior contrast as well as a fast response speed. Due to the merits of the organic light emitting element, it has been receiving attention as a next generation display element.

The organic light emitting element may further include at least one of organic layers interleaved among a hole injection layer (HIL), a hole transport layer (ETL), and an electron injection layer (EIL) according to whether an emission layer is made of a high molecular organic material or a low molecular organic material in addition to an organic emission layer.

In such an organic light emitting element, an organic layer is required to be patterned in order to realize full color. A low molecular organic light emitting element may be patterned using a shadow mask, and a high molecular organic light emitting element may be patterned through an ink-jet printing method and a laser induced thermal imaging (LITI) method using a laser. The LITI method is advantageous because the LITI method can pattern a large area of an organic layer. Furthermore, the LITI method can pattern an organic layer with high precision and with high resolution.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide a delamination apparatus that can minimize a failure occurring during a delamination process used in a thermal imaging method, and an inline thermal imaging system including the same.

One aspect of the present invention provides a delamination apparatus including: a stage mounted with a lower supporting member, an acceptor substrate positioned on the lower supporting member, and a donor film laminated along with the lower supporting member via the acceptor substrate interposed therebetween according to the edge of the acceptor substrate; a gripper positioned at an end side of the stage to grip the end of the donor film and moving in a direction away from the acceptor substrate; and a peeling roll positioned on the donor film, including a supporting region supporting a portion of the donor film positioned between the acceptor substrate and the gripper, and including a peeling roll main body rotating itself in a direction of the gripper and a blind selectively covering the supporting region.

The peeling roll main body may include: a fixed shaft through which air passes, and including a first slit penetrated in a direction between the acceptor substrate and the first gripper from the inside of the fixed shaft; an external roll surrounding the fixed shaft, rotating itself with respect to the fixed shaft, and including a plurality of second slits disposed along an outer part and penetrated in a direction of the fixed shaft; and a barrier supported by the fixed shaft, positioned between the fixed shaft and the external roll, and opening in a direction corresponding to the supporting region.

The blind may include: a rotating part supported by the end of the fixed shaft, extended from a center of the fixed shaft to a surface of the peeling roll main body, and selectively rotating with reference to the center of the fixed shaft; and a first blind main body extending in a curved line according to the external circumference of the peeling roll main body from the rotating part and selectively covering the supporting region.

The blind may further include a second blind main body positioned at the opening region and selectively covering the opening region.

The second blind main body may include a first sub-blind main body supported by one portion of the barrier adjacent to one end of the opening region, and a second sub-blind main body supported by another portion of the barrier adjacent to the other end of the opening region.

The peeling roll main body may further include a cover surrounding the external roll and positioned between the first blind main body and the external roll.

The cover may include: a first sub-cover part positioned corresponding to the end of the donor film and blocking the second slit; a second sub-cover part adjacent to the first sub-cover part, positioned corresponding to a portion of the donor film laminated along with the lower supporting member, and formed with a plurality of first penetration holes; and a third sub-cover part adjacent to the second sub-cover part, positioned corresponding to the acceptor substrate, and formed with a plurality of second penetration holes that are smaller than the first penetration holes.

The first blind main body may only correspond to the first sub-cover part and the second sub-cover part.

The opening region of the barrier may open a ¼ of an entire region of the external circumference of the fixed shaft.

The first blind main body may selectively cover the ¼ of the entire region of the external circumference of the fixed shaft.

The air may move from the second slit to the first slit.

The air may move in a direction from the first slit to the second slit.

Another aspect of the present invention provides an inline thermal imaging system including: the delamination apparatus of any one of claim 1 to claim 12; a transferring apparatus neighboring the delamination apparatus, and including a laser unit irradiating laser beams to the donor film corresponding to the acceptor film; a lamination apparatus neighboring the transferring apparatus, and including a lamination unit laminating the donor film to the lower support, interposing the acceptor substrate therebetween; and a stage movement apparatus respectively moving the stage to the lamination apparatus, the transferring apparatus, and the delamination apparatus.

According to the exemplary embodiments, a delamination apparatus and an inline thermal imaging system having the same may minimize defects generated during a delamination process using a thermal imaging method.

DETAILED DESCRIPTION OF THE INVENTION

Figure 1:
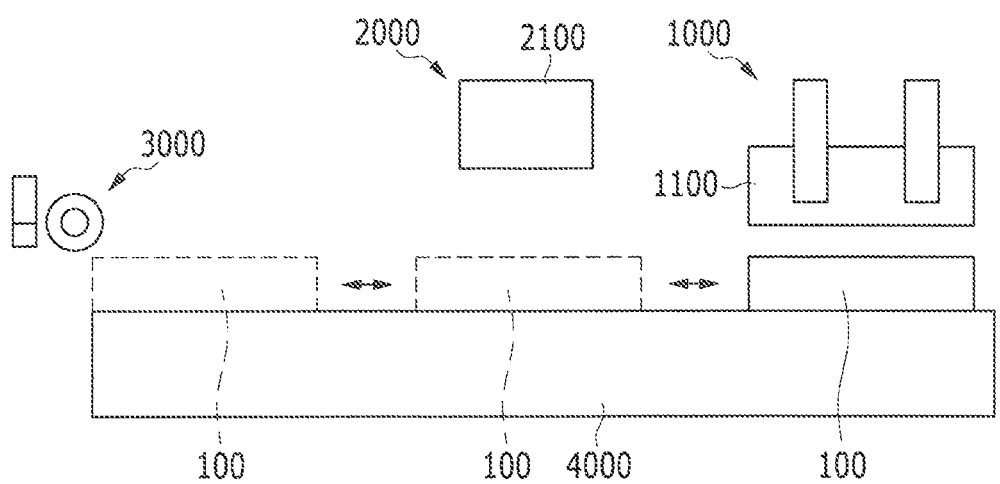
FIG. 1 is a view of an in-line thermal imaging system according to the first exemplary embodiment.

In the following detailed description, only certain exemplary embodiments have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

For various exemplary embodiments, constituent elements having the same constitution are designated by the same reference numerals and explained representatively in the first exemplary embodiment. In the other exemplary embodiments, only constituent elements different from those in the first exemplary embodiment are described.

In the drawings, a size and a thickness of each element is approximately shown for better understanding and ease of description. Therefore, the present invention is not limited to the drawings.

In the drawings, the thickness of layers, films, panels, regions, etc., are exaggerated for clarity. In the drawings, a size and a thickness of each element are exaggerated for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. It will be understood that when an element such as a layer, file, region, or substrate is referred to as being "on" another element, it can be on the other element or under the other element. The element may not be on another element in a gravity direction.

Hereinafter, an in-line thermal imaging system according to a first exemplary embodiment will be described with reference to FIG. 1 to FIG. 13.

FIG. 1 is a view of an in-line thermal imaging system constructed as a first embodiment according to the principles of the present invention.

As shown in FIG. 1, the inline thermal imaging system according to the first embodiment is an inline system that laminates a donor film to an acceptor substrate, transfers an organic layer formed in the donor film by irradiating laser beams, and delaminates the donor film from the acceptor film The inline thermal imaging system may include a lamination apparatus 1000, a transferring apparatus 2000, a delamination apparatus 3000, and a stage moving apparatus 4000. The stage moving apparatus 4000 moves stages 100 to which the acceptor substrate is mounted to the lamination apparatus 1000, the transferring apparatus 2000, and the delamination apparatus 3000, and may include a moving means such as a rail and the like and a driving means such as a motor and the like to drive the moving means. The stages 100 moved by the stage moving apparatus 4000 are respectively included in the lamination apparatus 1000, the transferring apparatus 2000, and the delamination apparatus 3000.

Figure 2:
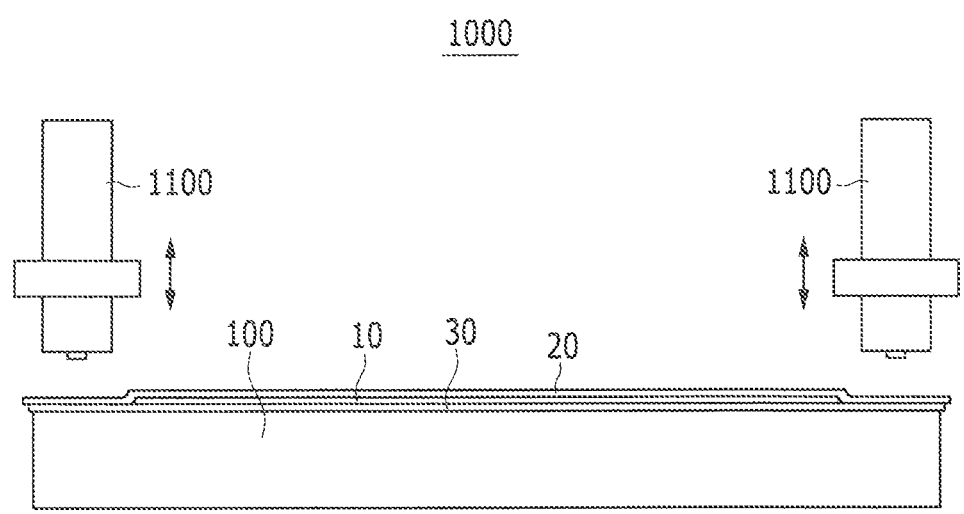
FIG. 2 is a view of a lamination apparatus shown in FIG. 1.

FIG. 2 is a view of the lamination apparatus shown in FIG. 1.

As shown in FIG. 2, the lamination apparatus 1000 is an apparatus for laminating a donor film 20 to an acceptor substrate 10, and includes the stage 100 and a lamination unit 1100.

A lower supporting member 30 formed in the shape of a film, the acceptor substrate 10 disposed on the lower supporting member 30, and the donor film 20 laminated with the lower supporting member 30 along the edge of the acceptor substrate 10, interposing the acceptor substrate 10, are mounted to the stage 100. The stage 100 may include a stage alignment key that corresponds to an alignment key formed in the acceptor substrate 10.

The lamination unit 1100 is movable up and down with respect to the stage 100 and maintains an area where the acceptor substrate 10 is located in a vacuum state, and then adheres the donor film 20 and the lower supporting member 30 using heat and the like along the edge of the acceptor substrate 10 of the stage 100. Accordingly, the lower supporting member 30 and the donor film 20 are laminated, interposing the acceptor substrate 10 therebetween, and the acceptor substrate 10 is sealed between the donor film 20 and the lower supporting member 30. Here, the lower supporting member 30 may be disposed between the stage 100 and the acceptor substrate 10 and between the stage 100 and the donor film 20.

In the first embodiment, the lower supporting member 30 is disposed between the stage 100 and the acceptor substrate 10 and between the stage 100 and the donor film 20, but when a lower supporting member 30 is omitted in another embodiment, a donor film 20 may be directly bonded with a stage 100 along the edge of an acceptor substrate 10.

Hereinafter, the acceptor substrate 10 laminated with the donor film 20 will be described.

Figure 3:
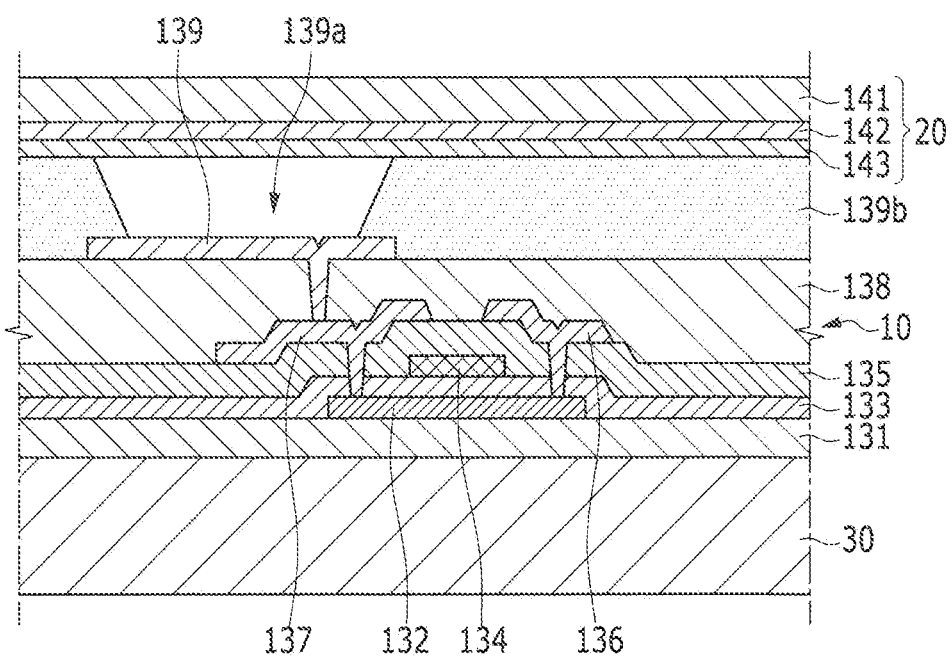
FIG. 3 is a cross-sectional view of an accepter substrate laminated with a donor film using the lamination apparatus shown in FIG. 2.

FIG. 3 is a cross-sectional view of the acceptor substrate laminated with the donor film using the lamination apparatus shown in FIG. 2.

As shown in FIG. 3, in the acceptor substrate 10, a semiconductor layer 132 is disposed in a predetermined area on a substrate 131. The semiconductor layer 132 may be an amorphous silicon layer or a polysilicon layer crystallized from the amorphous silicon layer. A gate insulating layer 133 that is a first insulating layer is disposed on the semiconductor layer 132. A gate electrode 134 overlapping the semiconductor layer 132 is disposed on the gate insulating layer 133. A second insulating layer 135 covering the semiconductor layer 132 and the gate electrode 134 is disposed on the gate electrode 134. A source electrode 136 and a drain electrode 137 respectively connecting lateral ends of the semiconductor layer 132 penetrating the second insulating layer 135 and the first insulating layer 133 are disposed on the second insulating layer 135. The semiconductor layer 132, the gate electrode 134, and the source/drain electrodes 136 and 137 form a thin film transistor T. A third insulating layer 138 covering the source/drain electrodes 136 and 137 is disposed on the source/drain electrodes 136 and 137. The third insulating layer 138 may be a passivation layer for protecting the thin film transistor T and/or a planarization layer for reducing a step difference due to the thin film transistor. A pixel electrode 139 connected with the drain electrode 137 is disposed on the third insulating layer 138 while penetrating the third insulating layer 138. The pixel electrode 139 may be, for example, an indium tin oxide (ITO) layer or an indium zinc oxide (IZO) layer. A pixel defining layer 139b having an opening that partially exposes the pixel electrode 139 may be disposed on the pixel electrode 139.

The donor film 20 laminated on the acceptor substrate 10 may include a base film 141, a light-to-heat conversion layer 142, and an organic layer 143. The light to heat conversion layer 142 and the organic layer 143 may be sequentially stacked on one side of the base film 141. The donor film 20 may have predetermined elasticity. The based film 141 may be made of a transparent high molecular organic material such as polyethylene terephthalate (PET), polyethylene naphthalate (PEN), polyethylene (PE), and polycarbonate (PC). The light-to-heat conversion layer 142 may convert incident light, which is laser light, to heat. The light-to-heat conversion layer 142 may include a light absorption material such as aluminum oxide, aluminum sulfide, carbon black, graphite, or an infrared ray dye. The organic layer 143 may be at least one selected from the group consisting of a hole injection layer (HIL), a hole transport layer (HTL), an electroluminescence layer, a hole suppression layer, an electron transport layer (ETL), and an electron injection layer (EIL).

Figure 4:
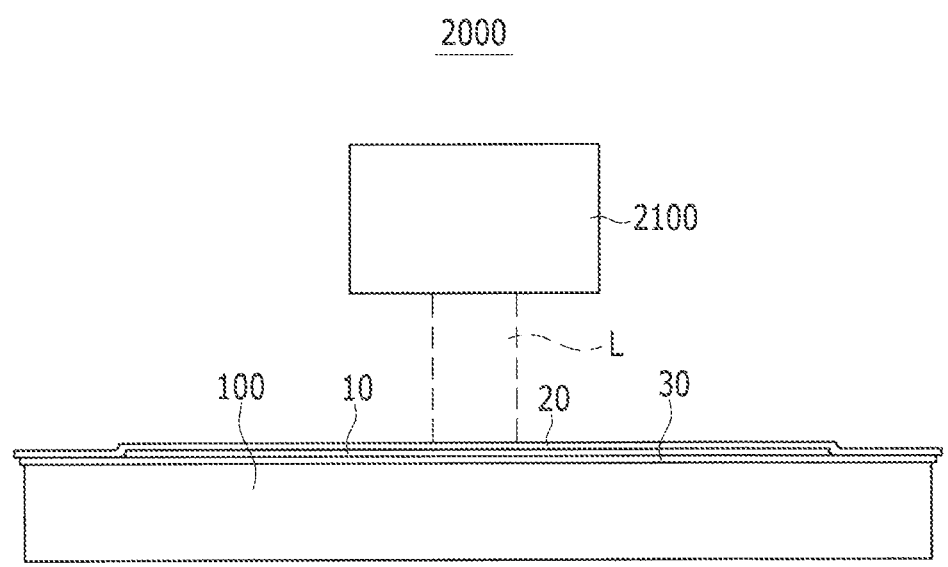
FIG. 4 is a view of a transferring apparatus shown in FIG. 1.

FIG. 4 is a view of the transferring apparatus of FIG. 1.

As shown in FIG. 1 and FIG. 4, the transferring apparatus 2000 disposed between the lamination apparatus 1000 and the delamination apparatus 3000 may transport an organic layer of the donor film 20 laminated on the acceptor substrate 10 to the acceptor substrate 10. The transferring apparatus 2000 may include the stage 100 and a laser unit 2100.

The laser unit 2100 may radiate laser light L at the donor film 20 corresponding to a substrate area SA of the stage 100. Due to the laser light L, the organic layer 143 formed on the donor film 20 may be transferred to the acceptor substrate 10. The laser light L may be radiated to the donor film 20 corresponding to an opening 139a of the acceptor substrate 10 shown in FIG. 3.

The transferring apparatus 2000 may include a thermal imaging unit instead of the laser unit 2100, and in this case, the thermal imaging unit may transfer the organic layer 143 formed in the donor film 20 to the acceptor substrate 10 by applying heat to the donor film 20.

Hereinafter, the acceptor substrate 10 where the organic layer 143 of the donor film 20 is transferred will be described.

Figure 5:
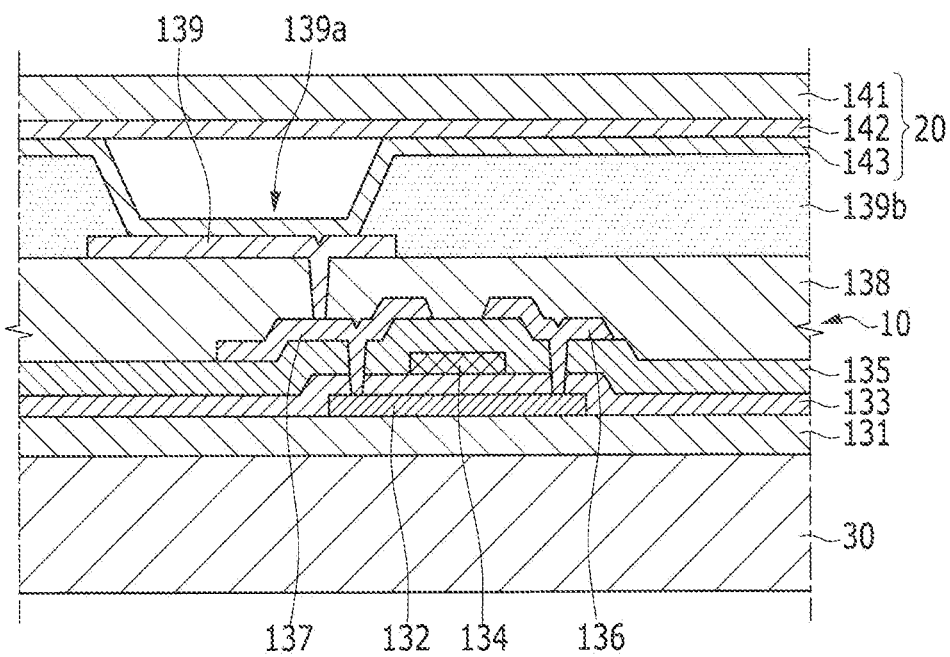
FIG. 5 is a cross-sectional view of an accepter substrate to which an organic layer of the donor film is transferred using the transferring apparatus shown in FIG. 4.

FIG. 5 is a cross-sectional view illustrating an acceptor substrate having an organic layer of a donor film transferred using a transport apparatus of FIG. 4.

As shown in FIG. 5, the organic layer 143 may be transferred to the acceptor substrate 10 corresponding to the opening 139a of the acceptor substrate 10.

Figure 6:
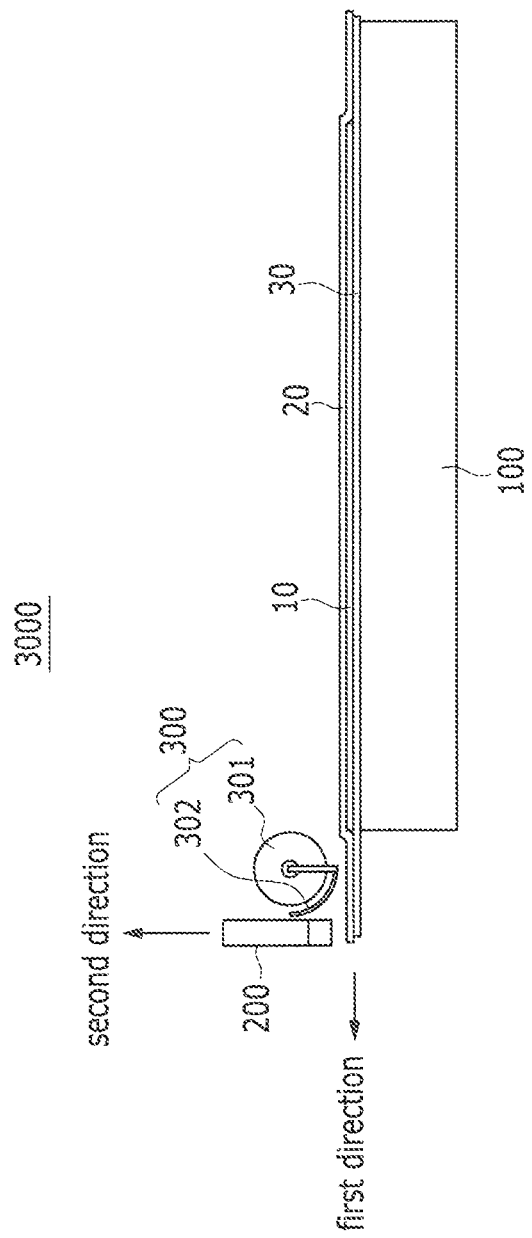
FIG. 6 is a side view of a delamination apparatus shown in FIG. 1.
Figure 7:
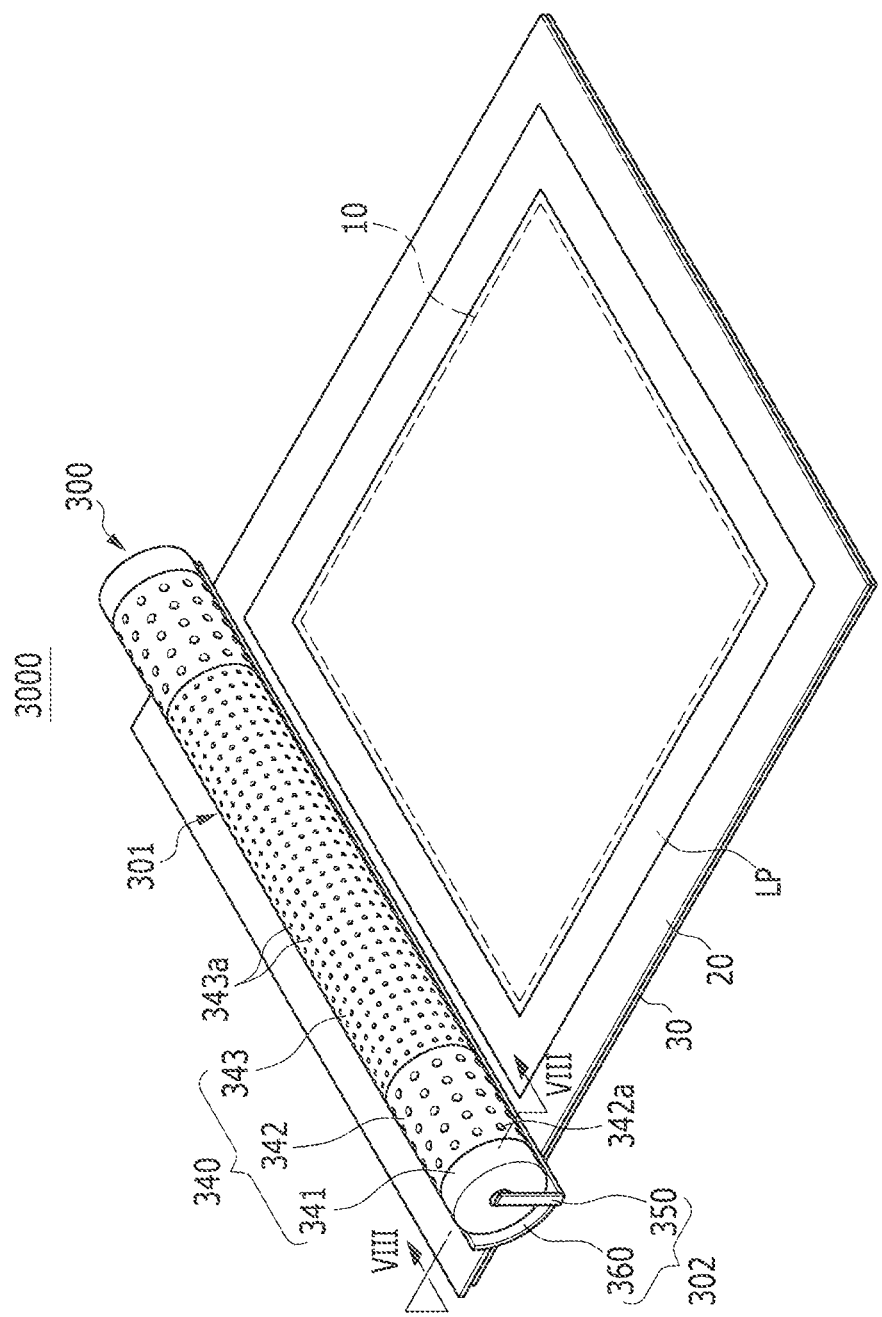
FIG. 7 is an oblique view of a delamination apparatus shown in FIG. 1.
Figure 8:
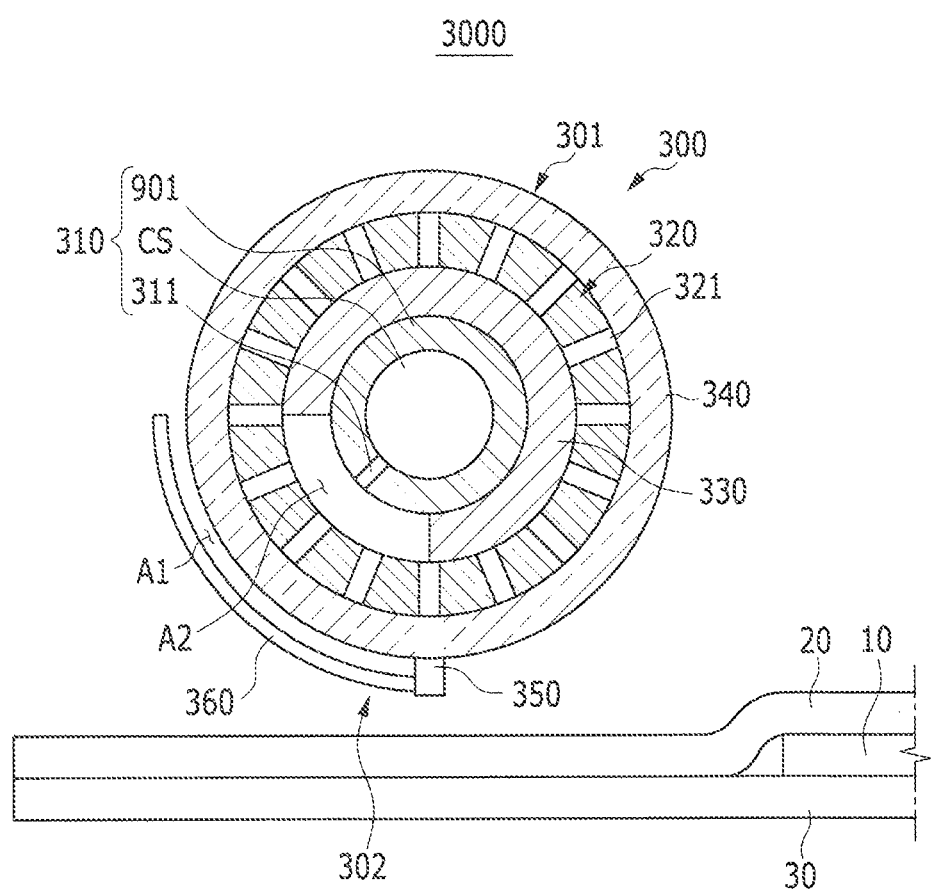
FIG. 8 is a cross-sectional view of the delaminating apparatus, taken along line VIII-VIII shown in FIG. 7.

FIG. 6 to FIG. 8 are views of the delamination apparatus of FIG. 1.

As shown in FIG. 6, the delamination apparatus 3000 is adjacent to the transferring apparatus 2000, and delaminates the donor film 20 from the acceptor substrate 10 where the organic layer 143 is transferred. The delamination apparatus 3000 includes the stage 100, a gripper 200, and a peeling roll 300.

The gripper 200 is disposed at an end of the stage 100, and grips the end of the donor film 20. The gripper 200 moves the donor film 20 in a direction, for example, a second direction, away from the acceptor substrate 10, for example, to an upper side, by gripping the end of the donor film 20 to separate the end of the donor film 20 from the lower supporting member 30. When the gripper 200 separates the end of the donor film 20 from the lower supporting member 30, the donor film 20 contacts the peeling roll 300.

FIG. 7 is an oblique view of the peeling roll, the lower support, the acceptor substrate, and the donor film shown in FIG. 6. FIG. 8 is a cross-sectional view of FIG. 7, taken along the line VIII-VIII.

As shown in FIG. 6 to FIG. 8, the peeling roll 300 is disposed on the donor film 20. The peeling roll 300 supports the donor film 20 disposed between the acceptor substrate 10 and the gripper 200. Here, the supporting the donor film 20 implies suction or blowing a portion of the donor film 20.

The peeling roll 300 includes a peeling roll main body 301 and a blind 302. The peeling roll 300 also includes a fixed shaft 310, an external roll 320, a barrier 330, and a cover 340.

The peeling roll main body 301 includes a supporting region A1 supporting a portion of the donor film 20 positioned between the acceptor substrate 10 and the gripper 200. The peeling roll main body 301 rotates around a longitudinal axis of the fixed shaft 310. For example, the peeling roll main body 301 rotates in a clockwise direction to delaminate the donor film 20 from the lower supporting member 30. More specifically, when the peeling roll main body 301 rotates, the stage moving apparatus 4000 correspondingly moves the stage 100 in a first direction together with the lower supporting member 30, accepter substrate 10, and donor film 20 disposed on the stage 100 at a same speed as an external surface of the peeling roll main body 301. Meanwhile, the gripper 200, which grips the end of the donor film 20, correspondingly moves at the same speed as the external surface of the peeling roll main body 301 in a direction away from a loading surface of the stage moving apparatus 4000.

Fixed Shaft

The fixed shaft 310 includes a connection space CS and a wall 901 which forms the connection space CS. The fixed shaft 310 also includes a first slit 311 formed in the wall 901 corresponding to the supporting region A1 positioned in a direction between the acceptor substrate 10 and the gripper 200. Thus, the first slit 311 is directly connected to the connection space CS. Accordingly, the connection space CS and the first slit 311 forms an air tunnel through which air or a gas such as nitrogen (N) or oxygen (O) is moved. The fixed shaft 310 is disposed in a fixed stated on the donor film 20 and does not rotate. That is, the wall 901 of the fixed shaft 310 is fixed and does not rotate.

The external roll 320 surrounds the fixed shaft 310, and rotates itself with respect to the fixed shaft 310. More specifically, the external roll 320 is rotatable around the longitudinal axis of the fixed shaft 310. The external roll 320 includes a plurality of second slits 321 disposed along the outer part and penetrating the fixed shaft 310. A bearing 330 may be provided between the external roll 320 and the fixed shaft 310, and the peeling roll 300 rotates by itself as the external roll 320 rotates by itself. In detail, the peeling roll 300 is rotatable around the longitudinal axis of the fixed shaft 310.

The barrier 330 supported by the fixed shaft 310 is disposed between the fixed shaft 310 and the external roll 320, and includes an opening region A2 opening in a direction corresponding to the supporting region A1 as the direction between the acceptor substrate 10 and the gripper 200. The opening region A2 of the barrier 330 opens a ¼ area of the entire area surrounding the outer part of the fixed shaft 310. For example, the opening region A2 of the barrier 330 opens an area rotated 90 degrees from a direction that is perpendicular to the plate surface of the donor film 20.

The connection space CS may be connected to an external compressed air or gas source (not shown) or an external vacuum source (not shown) to drive air contained in the peeling roll to move. The air that passes through the connection space CS may move in a direction of the first slit direction 311 from the second slit 321 or may move in a direction of the second slit 321 from the first slit 311. When the air passing through the connection space CS moves in the first slit 311 direction from the second slit 321, the peeling roll 300 sucks the donor film 20 disposed between the acceptor substrate 10 and the gripper 200 to support the donor film 20 disposed between the acceptor substrate 10 and the gripper 200. In addition, when the air passing through the connection space CS moves to the second slit 321 direction from the first slit 311, the peeling roll 300 forms an air layer between the peeling roll 300 and the donor film 20 by blowing the donor film 20 disposed between the acceptor substrate 10 and the gripper 200 to support the donor film 20 disposed between the acceptor substrate 10 and the gripper 200.

The cover 340 surrounds the external roll 320 and is positioned between the blind 302 and the external roll 320. The cover 340 may rotate around the fixed shaft 310 at a same angular speed as the external roll 320. The cover 340 includes a first sub-cover part 341, a second sub-cover part 342, and a third sub-cover part 343.

The first sub-cover 341 is disposed corresponding to an end of the donor film 20 and blocks the second slit 321 of the external roll 320.

The second sub-cover 342 is adjacent to the first sub-cover part 341 and is disposed corresponding to a portion LP of the donor film 20 laminated with the lower supporting member 30. The second sub-cover 342 includes a plurality of first penetration holes 342a formed along the outer part. The air passing through the connection space CS of the fixed shaft 310 passes through the first slit 311, the second slit 321, and the first penetration hole 342a.

The third sub-cover 343 is adjacent to the second sub-cover 342 and is disposed corresponding to the acceptor substrate 10. The third sub-cover 343 includes a plurality of second penetration holes 343a formed along the outer part. The second penetration hole 343a is formed to be smaller than the first penetration hole 342a. The air having passed through the connection space CS of the fixed shaft 310 passes through the first slit 311, the second slit 321, and the second penetration hole 343a.

The blind 302 selectively covers the supporting region A1 of the peeling roll main body 301. The blind 302 includes a rotating part 350 and a first blind main body 360.

The rotating part 350 is connected to the end of the fixed shaft 310 and is extended from the center of the fixed shaft 310 to the surface of the peeling roll main body 301. The rotating part 350 selectively rotates with reference to the center of the fixed shaft 310, and the rotating part 350 rotates such that the first blind main body 360 selectively covers the supporting region A1. The rotating part 350 rotates in a clockwise direction or a counterclockwise direction with reference to the fixed shaft 310, and the rotating part 350 rotates such that the first blind main body 360 selectively covers the supporting region A1.

The first blind main body 360 extends in a curved line according to the external circumference of the peeling roll main body 301 from the end of the rotating part 350 and selectively covers the supporting region A1. The first blind main body 360 extends from one end of the peeling roll main body 301 to the other end thereby being disposed between the peeling roll main body 301 and the donor film 20. The first blind main body 360 selectively covers the supporting region A1 of the peeling roll main body 301 by rotating the rotating part 350. That is, the first blind main body 360 selectively covers the opening region A2 of the barrier 330 that is a ¼ region of the external circumference of the fixed shaft 310.

The blind 302 covers the supporting region A1 of the peeling roll main body 301 before the peeling roll main body 301 supports the donor film 20. As described above, by covering the supporting region A1 of the peeling roll main body 301 through the blind 302, the delamination apparatus 3000 prevents foreign particles from flowing into the second slit 321 and the first slit 311 corresponding to the supporting region A1 of the peeling roll main body 301 from the outside.

That is, the foreign particles are prevented from flowing into the second slit 321 and the first slit 311 when passing the air by including the blind 302 of the peeling roll 300 such that blocking of the second slit 321 and the first slit 311 due to the foreign particles is suppressed, and thereby the donor film 20 may be delaminated from the acceptor substrate 10 and the lower supporting member 30 by using the initial air pressure that is uniformly predetermined.

Hereinafter, a delamination process using the delamination apparatus 3000 will be described in further detail with reference to FIG. 9 to FIG. 12.

FIG. 9 to FIG. 12 are views to explain a delamination process using the delamination apparatus of FIG. 6 to FIG. 8.

Figure 9:
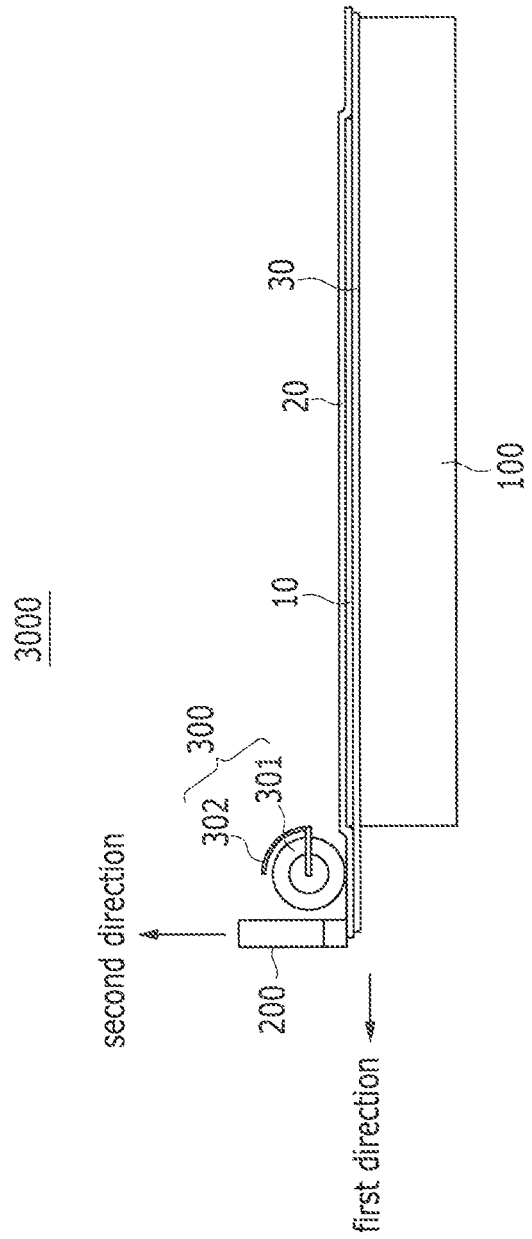
FIG. 9 through FIG. 12 show a delamination process using the delamination apparatus shown in FIG. 6 through FIG. 8.

First, as shown in FIG. 9, the end of the donor film 20 is gripped using the gripper 200. In this case, the peeling roll 300 is disposed on the donor film 20, and may contact the donor film 20 or may be separated from the donor film 20. At this time, the rotating part 350 of the blind 302 is rotated with respect to the fixed shaft 310 such that the first blind main body 360 covers the region except for the supporting region A1 of the peeling roll main body 301.

Figure 10:
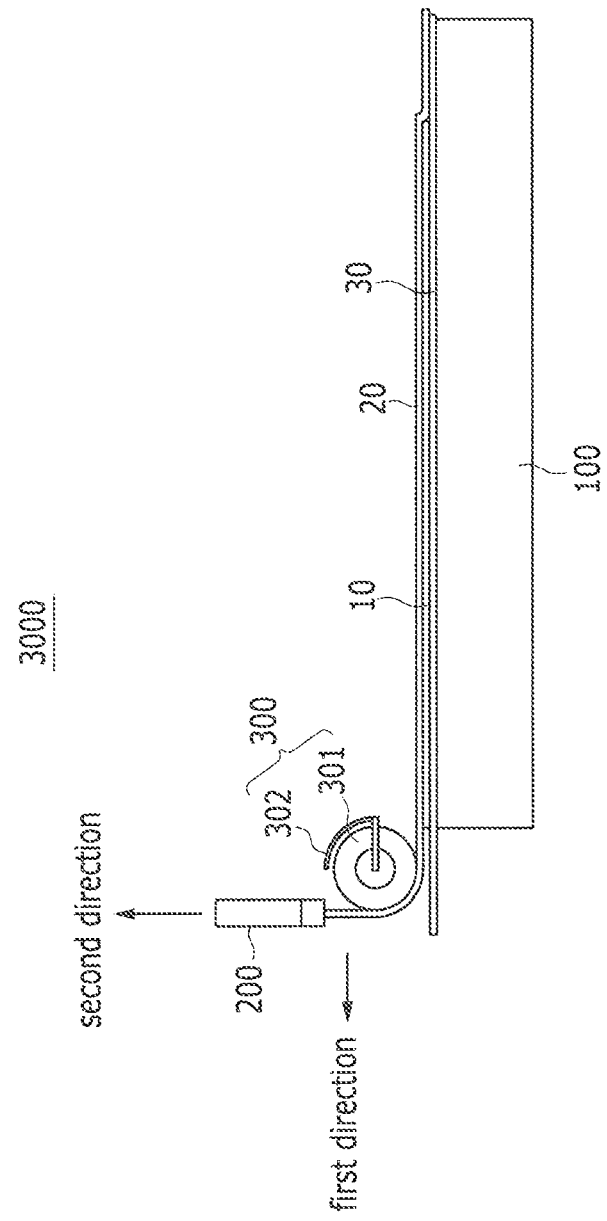

Next, as shown in FIG. 10, the gripper 200 is moved to an upper side to separate the end of the donor film 20 from the lower supporting member 30 such that the donor film 20 is supported by the peeling roll main body 301.

Figure 11:
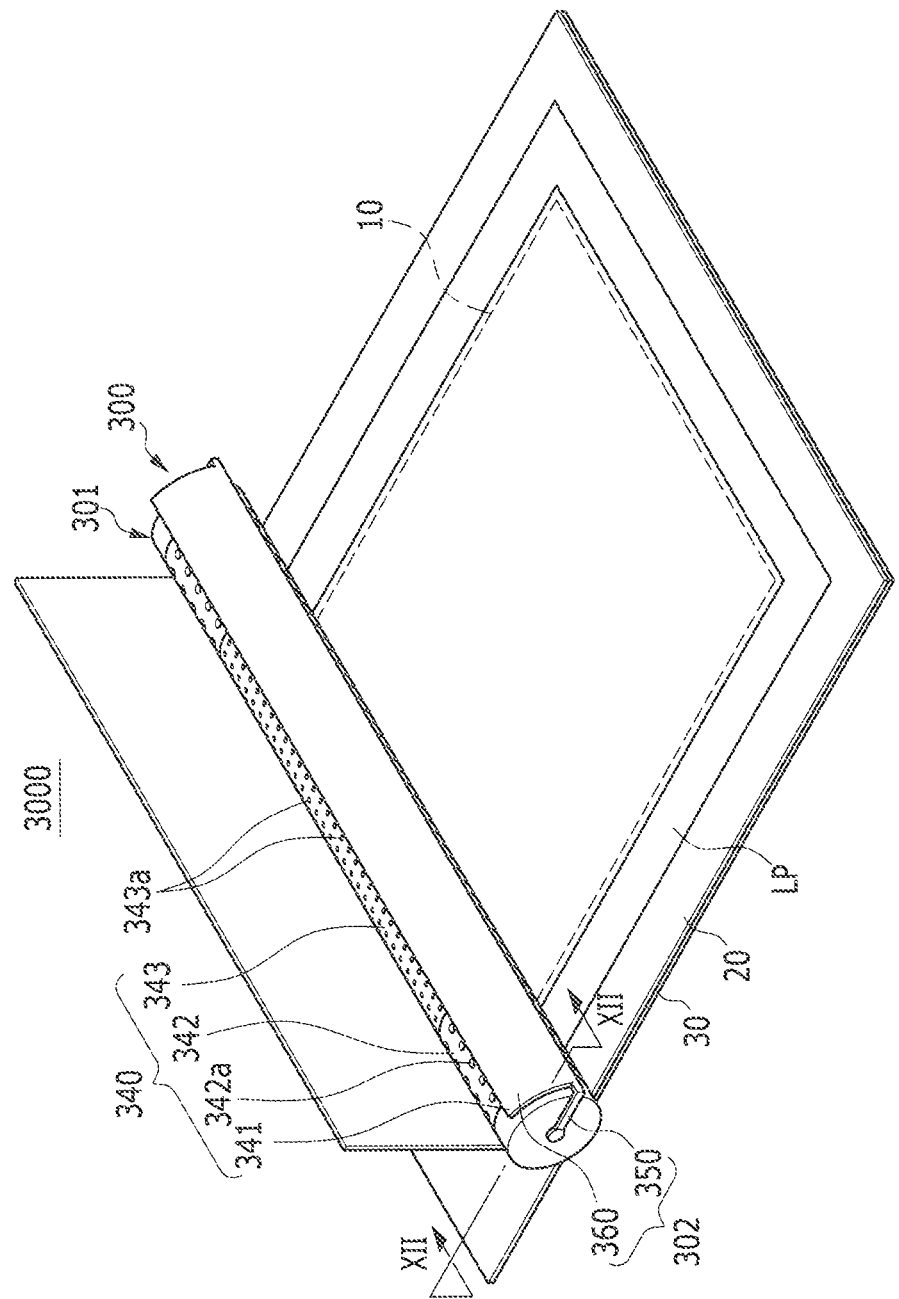
Figure 12:
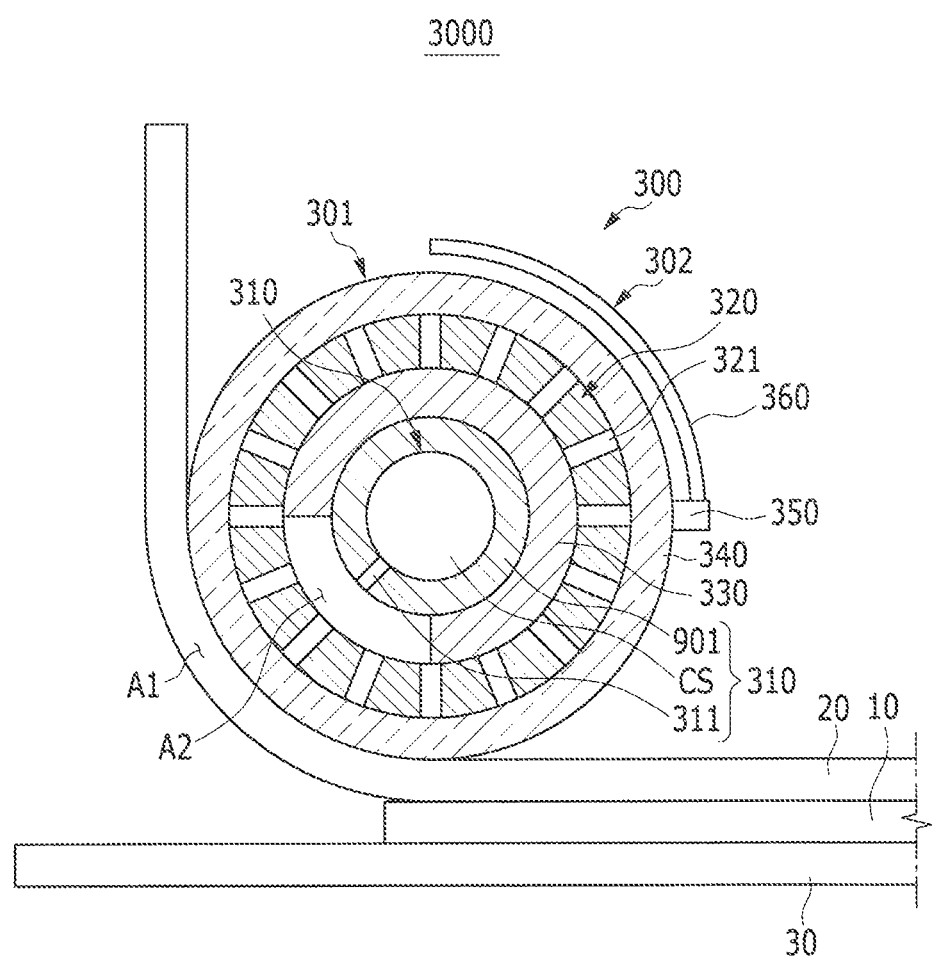

FIG. 11 is a view showing the peeling roll, the lower supporting member, the acceptor substrate, and the donor film shown in FIG. 10. FIG. 12 is a cross-sectional view taken along the line XII-XII of FIG. 11.

Next, as shown in FIG. 11 and FIG. 12, the peeling roll 300 rotates itself and thus the donor film 20 is delaminated from the lower supporting member 30.

In further detail, in the state that the first blind main body 360 covers the region except for the supporting region A1 of the peeling roll main body 301, since the air is sucked or blown to the supporting region A1 in the direction between the acceptor substrate 10 and the first gripper 200 while the external roll 320 rotates with respect to the shaft 310 in the fixed state, the peeling roll 300 rotates itself while the donor film 20 disposed between the acceptor 10 and the gripper 200 is supported by the peeling roll 300 so that the donor film 20 is delaminated from the lower supporting member 30.

In this case, the end of the donor film 20 is pressed by the first sub-cover 341 corresponding to the first sub-cover 341 that blocks the second slit 321 of the external roll 320 so that the end of the donor film 20 can be prevented from being lifted due to suction or blowing of the peeling roll 300. Thus, particles that can be generated due to separation of the donor film 20 from the lower supporting member 30 or external air can be prevented from penetrating into the acceptor substrate 10 disposed between the donor film 20 and the lower supporting member 30.

In addition, since the portion LP of the donor film 20 laminated with the lower supporting member 30 is supported by the peeling roll 300 corresponding to the second sub-cover 342 including the first penetrating hole 342a formed to be larger than the second penetrating hole 343a, suction or blowing is locally performed with a relatively high force so that the delamination from the lower supporting member 30 can be easily performed.

In addition, the center area of the donor film 20 corresponding to the acceptor substrate 10 is supported by the peeling roll 300 corresponding to the third sub-cover 343 including the second penetration hole 343a formed to be smaller than the first penetration hole 342a so that suction or blowing is locally performed with a relatively low force, thereby suppressing a failure of delamination of the donor film 20 from the lower supporting member 30 in the acceptor substrate 10 that may occur.

As described, the peeling roll 300 supports the donor film 20 disposed between the acceptor substrate 10 and the gripper 200 rather than supporting the donor film 20 disposed between the acceptor substrate 10 and the peeling roll 300 to delaminate the donor film 20 from the lower supporting member 30, and accordingly a failure that may occur in the acceptor substrate 10 due to suction or blowing of the peeling roll 300 can be preemptively prevented.

Further, the peeling roll 300 supports the donor film 20 by sucking or blowing the donor film 20 so that the donor film 20 can be prevented from being separated from the peeling roll 300. This can be a factor for improvement of reliability of the entire delamination process.

Next, another example of the peeling roll 300 included in the delamination apparatus 3000 will be described with reference to FIG. 13.

Figure 13:
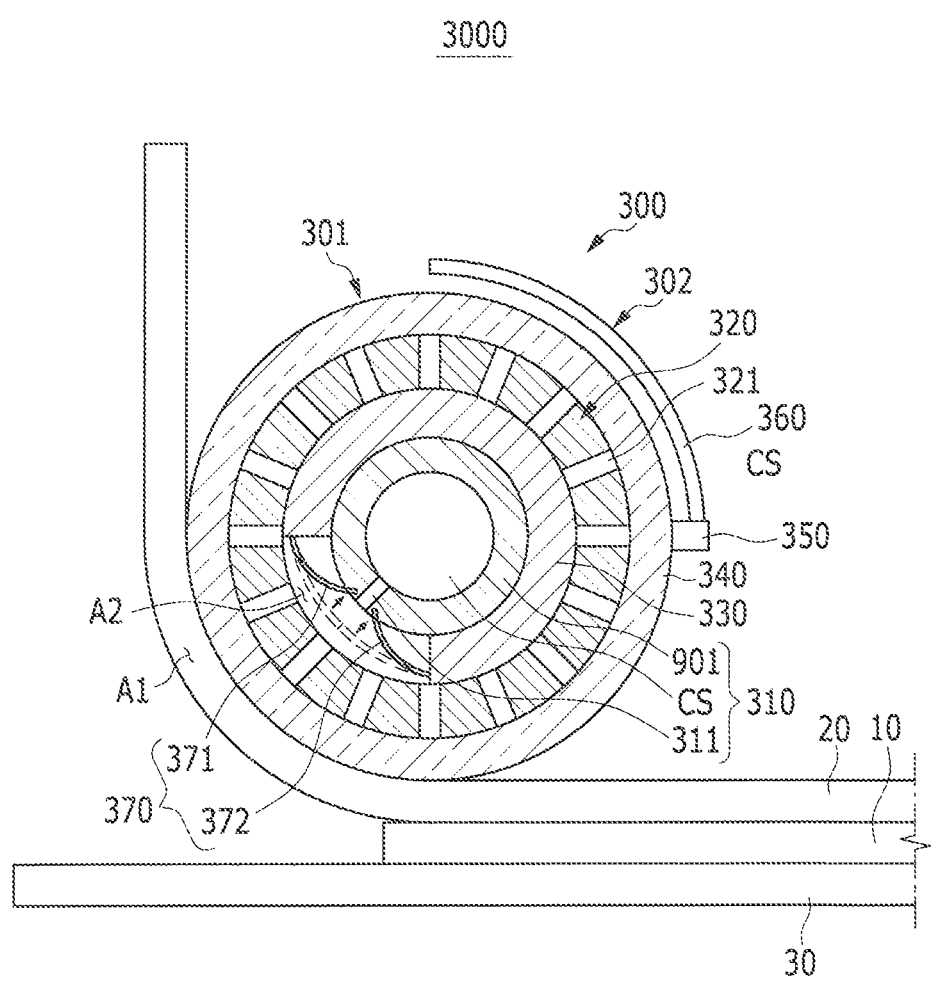
FIG. 13 is a cross-sectional view of another example of a peeling roll included in a delamination apparatus.

FIG. 13 is a cross-sectional view of another example of the peeling roll included in the delamination apparatus.

As shown in FIG. 13, the blind 302 of the peeling roll 300 further includes a second blind main body 370.

The second blind main body 370 is positioned inside the opening region A2 of the barrier 330 and selectively covers the opening region A2. The second blind main body 370 includes a first sub-blind main body 371 and a second sub-blind main body 372.

The first sub-blind main body 371 is supported by one portion of the barrier 330 adjacent to one end of the opening region A2 to be selectively rotated, and the second sub-blind main body 372 is supported by the other portion of the barrier 330 adjacent to the other end of the opening region A2 to be selectively rotated. The first sub-blind main body 371 and the second sub-blind main body 372 may be respectively supported by one portion and the other portion of the bather 330 by a hinge to be rotated.

As described, the second blind main body 370 selectively covers the opening region A2 such that the flowing of foreign particles into the first slit 311 through the opening region A2 from the outside is suppressed. The second blind main body 370 covers the opening region A2 of the bather 330 before the peeling roll main body 301 supports the donor film 20 to cover the supporting region A1 of the peeling roll main body 301. As described above, by covering the supporting region A1 of the peeling roll main body 301 by the blind 302, the foreign particles are prevented from flowing into the first slit 311 corresponding to the supporting region A1 of the peeling roll main body 301 from the outside.

That is, the foreign particles are prevented from flowing into the second slit 321 and the first slit 311 by including the blind 302 having the first blind main body 360 and the second blind main body 370 when passing the air by the peeling roll 300 such that the blocking of the second slit 321 and the first slit 311 due to the foreign particles is suppressed before the peeling roll main body 301 supports the donor film 20, and thereby the donor film 20 may be easily delaminated from the acceptor substrate 10 and the lower supporting member 30 by using the initial air pressure that is uniformly predetermined when the peeling roll main body 301 supports the donor film 20.

Next, the acceptor substrate 10 with the donor film 20 delaminated therefrom will be described.

Figure 14:
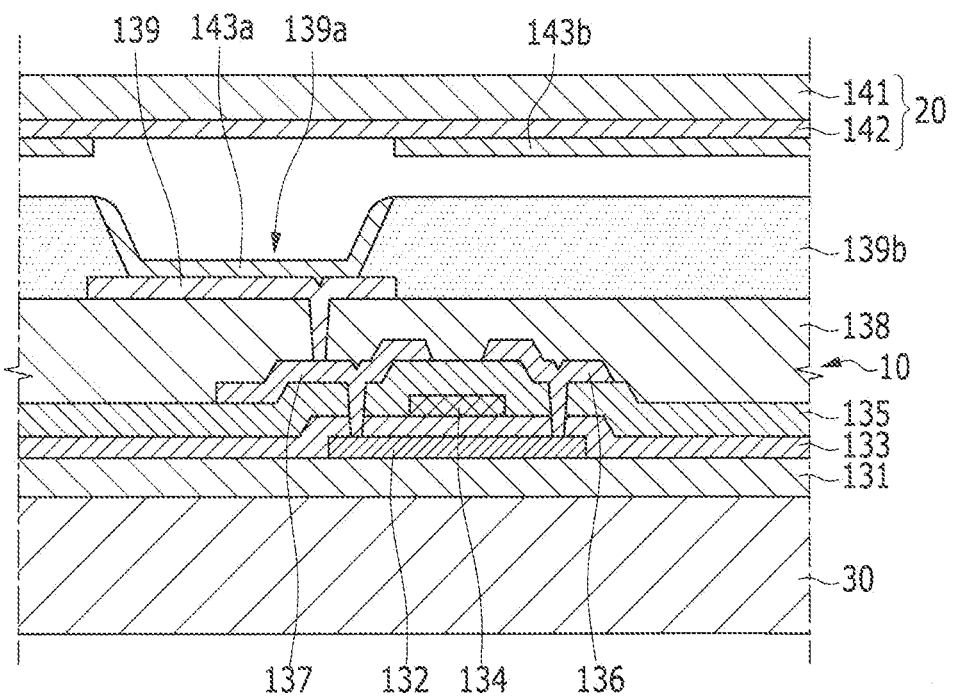
FIG. 14 is a cross-sectional view of an accepter substrate with a donor film delaminated therefrom through the delamination process shown in FIG. 9 through FIG. 12.

FIG. 14 is a cross-sectional view of the acceptor substrate with the donor film delaminated therefrom by the delamination process shown in FIG. 9 to FIG. 12.

As shown in FIG. 14, since the donor film 20 is separated from the acceptor substrate 10, an organic layer 143a transferred corresponding to the opening 139a of the acceptor substrate 10 is separated from an organic layer 143b remaining in the donor film 20, and the organic layer 143a functions as a light emission means of an organic light emitting element.

As described above, the inline thermal imaging system according to the first exemplary embodiment may include the lamination apparatus 1000, the transferring apparatus 2000, and the delamination apparatus 3000, which share the stage 100. The inline thermal imaging system according to the first embodiment may perform the lamination process, the imaging process, and the delamination process in an inline manner.

Also, in the in-line thermal imaging system according to the first embodiment, the blind 302 of the delamination apparatus 3000 covers the supporting region A1 of the peeling roll main body 301 such that the foreign particles are prevented from flowing into the second slit 321 and the first slit 311 corresponding to the supporting region A1 of the peeling roll main body 301 from the outside. That is, the foreign particles are prevented from flowing in to the second slit 321 and the first slit 311 passing the air by including the blind 302 of the peeling roll 300 such that the blocking of the second slit 321 and the first slit 311 due to the foreign particles is suppressed, and thereby the donor film 20 may be delaminated from the acceptor substrate 10 and the lower supporting member 30 by using the air pressure that is uniformly predetermined.

That is, the delamination apparatus that can minimize a failure occurring during a delamination process used in a thermal imaging method, and the inline thermal imaging system including the same are provided. Hereafter, a delamination apparatus according to a second exemplary embodiment will be described with reference to FIG. 15.

Hereinafter, only characteristic components distinguished from the first embodiment will be extracted and described, and the components omitted from the description follow the first embodiment. In addition, in the second embodiment, for convenience of description, like constituent elements will be described by using like reference numerals of the first embodiment.

Figure 15:
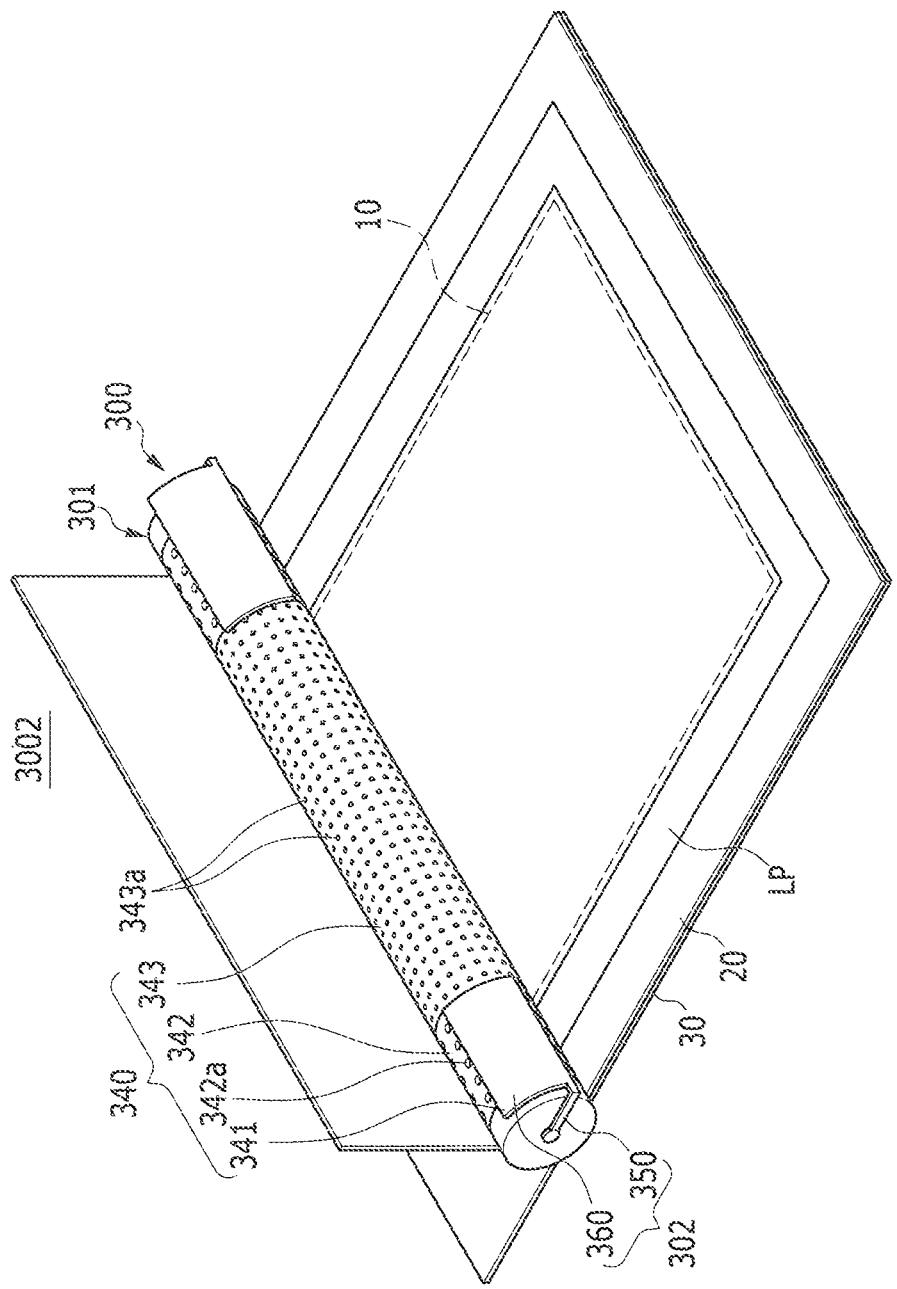
FIG. 15 is a view of a delamination apparatus constructed as a second embodiment according to the principles of the present invention.

FIG. 15 is a view of a delamination apparatus constructed as the second embodiment according to the principles of the present invention.

As shown in FIG. 15, the first blind main body 360 of the blind 302 of the peeling roll 300 of the delamination apparatus 3002 according to the second embodiment only corresponds to the first sub-cover part 341 and the second sub-cover part 342 of the peeling roll main body 301.

As described above, in the delamination apparatus 3002 according to the second embodiment, the first blind main body 360 only corresponds to the first sub-cover part 341 and the second sub-cover part 342 of the peeling roll main body 301 such that the foreign particles are suppressed from flowing into the first penetration hole 342a having the larger size than the second penetration hole 343a from the outside.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A delamination apparatus, comprising:
   a stage mounted with a lower supporting member, an acceptor substrate positioned on the lower supporting member, and a donor film laminated along with the lower supporting member via the acceptor substrate interposed between the lower supporting member and the donor film;
   a gripper positioned at an end of the stage, and configured to grip an end of the donor film and to be movable in a direction crossing a plate surface of the stage; and
   a peeling roll positioned on the stage, the peeling roll including:
   a supporting region supporting a portion of the donor film positioned between the acceptor substrate and the gripper;
   a peeling roll main body configured to be rotatable around an axis of the peeling roll; and
   a blind movable between a first position at the supporting region and a second position away from the supporting region by rotating the blind around the axis of the peeling roll.

2. The delamination apparatus of claim 1, wherein the peeling roll main body includes:
   a fixed shaft including a cylindrical wall forming a space through which air passes, and including a first slit penetrated the cylindrical wall;
   an external roll surrounding the fixed shaft, configured to be rotatable with respect to the fixed shaft, and including a plurality of second slits disposed along an outer part and penetrated the external roll in a radial direction of the fixed shaft; and
   a barrier supported by the fixed shaft, positioned between the fixed shaft and the external roll, and having an opening formed between the supporting region and the first slit.

3. The delamination apparatus of claim 2, wherein the blind includes:
   a first blind main body extending in a curved line conforming to an external circumference of the peeling roll main body; and
   a rotating part supported by an end of the peeling roll main body, and connected to the first blind main body.

4. The delamination apparatus of claim 3, further comprising another blind positioned at the opening and selectively covering the opening.

5. The delamination apparatus of claim 4, wherein the other blind includes:
   a first sub-blind main body supported by one portion of the barrier adjacent to one end of the opening; and
   a second sub-blind main body supported by another portion of the barrier adjacent to another end of the opening.

6. The delamination apparatus of claim 3, wherein the peeling roll main body further includes a cover surrounding the external roll and positioned between the first blind main body and the external roll.

7. The delamination apparatus of claim 6, wherein the cover includes:
   a first sub-cover part positioned adjacent to an end of the donor film and blocking a portion of the plurality of second slits;
   a third sub-cover part positioned at a center portion of the cover, and formed with a plurality of second penetration holes;
   a second sub-cover part positioned between the first and third sub-cover parts, and formed with a plurality of first penetration holes, a size of each second penetration hole being less than a size of each first penetration hole.

8. The delamination apparatus of claim 7, wherein the first blind main body only covers the first sub-cover part and the second sub-cover part.

9. The delamination apparatus of claim 3, wherein a ratio of a sum of an area of the fixed shaft exposed by the opening of the barrier and an area of the first slit to an area of the fixed shaft covered by the barrier is 1 to 3.

10. The delamination apparatus of claim 9, wherein the first blind main body selectively covers an entire region of the external circumference of the fixed shaft exposed by the opening of the barrier.

11. The delamination apparatus of claim 2, wherein the air moves in a direction from a portion of the plurality of second slits to the first slit.

12. The delamination apparatus of claim 2, wherein the air moves in a direction from the first slit to a portion of the plurality of second slits.

13. An inline thermal imaging system, comprising:
   the delamination apparatus of claim 1;
   a transferring apparatus including a laser unit selectively irradiating laser beams to the donor film formed on the acceptor film;
   a lamination apparatus including a lamination unit laminating the donor film to the lower support member, interposing the acceptor substrate between the donor film and the lower support member; and
   a stage movement apparatus respectively moving the stage to the lamination apparatus, the transferring apparatus, and the delamination apparatus.

14. A delamination apparatus, comprising:
   a stage configured to be movable in a first direction;
   a gripper positioned at an end of the stage, and configured to grip an end of a substrate disposed on the stage and to be movable in a second direction crossing the first direction; and
   a peeling roll positioned on the stage, the peeling roll including:
   a fixed shaft including a cylindrical wall forming a connection space and a first slit penetrating the wall, a longitudinal axis of the fixed shaft being perpendicular to the first direction and the second direction;

a rotatable cover surrounding the fixed shaft and including a plurality of holes, at least a portion of the plurality of holes and the connection space of the fixed shaft forming an air tunnel; and a first blind disposed spaced-apart from the rotatable cover and rotatable around the longitudinal axis of the fixed shaft.

15. The delamination apparatus of claim 14, wherein the peeling roll further includes:

a rotatable external roll positioned between the fixed shaft and the rotatable cover of the peeling roll, a plurality of second slits each penetrating the external roll in a radial direction of the external roll; and a barrier positioned between the external roll and the fixed shaft, a third slit formed in the barrier so that the first slit is disposed between the longitudinal axis of the fixed shaft and the third slit.

16. The delamination apparatus of claim 15, wherein the first slit of the fixed shaft and the third slit of the barrier are interposed between the longitudinal axis of the fixed shaft and a third direction, the third direction crossing an intersection of the first and second directions and being parallel to the longitudinal axis of the fixed shaft.

17. The delamination apparatus of claim 15, wherein the peeling roll further includes a second blind disposed in the third slit of the barrier and selectively exposing the first slit of the fixed shaft.

18. The delamination apparatus of claim 14, wherein the plurality of holes includes:

a plurality of first holes disposed at a center portion of the rotatable cover; and a plurality of second holes disposed between the center portion and one end portion of the rotatable cover and between the center portion and another end portion of the rotatable cover, a size of each second hole being larger than a size of each first hole.

19. The delamination apparatus of claim 18, wherein the first blind does not cover the plurality of first holes.

20. The delamination apparatus of claim 14, wherein the first blind extends between opposite ends of the cover.

* * * * *